United States Patent
Ohtsuka et al.

(10) Patent No.: US 8,069,296 B2
(45) Date of Patent: Nov. 29, 2011

(54) SEMICONDUCTOR MEMORY DEVICE INCLUDING CONTROL MEANS AND MEMORY SYSTEM

(75) Inventors: Noboru Ohtsuka, Yokohama (JP); Kazuki Oda, Yokohama (JP); Kenji Tsuchiya, Yokohama (JP); Tatsuya Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1185 days.

(21) Appl. No.: 11/443,059

(22) Filed: May 31, 2006

(65) Prior Publication Data

US 2009/0037643 A1 Feb. 5, 2009

(30) Foreign Application Priority Data

Jan. 23, 2006 (JP) ................................. 2006-014131
Feb. 6, 2006 (JP) ................................. 2006-028563

(51) Int. Cl.
*G06F 13/00* (2006.01)
*G06F 13/28* (2006.01)
(52) U.S. Cl. ................. 711/103; 711/149; 711/E12.007
(58) Field of Classification Search .................. 711/103, 711/149, E12.007
See application file for complete search history.

(56) References Cited

U.S. PATENT DOCUMENTS

| | | | | |
|---|---|---|---|---|
| 4,479,097 A | * | 10/1984 | Larson et al. ................. | 331/111 |
| 5,347,428 A | * | 9/1994 | Carson et al. ................. | 361/760 |
| 6,363,009 B1 | * | 3/2002 | Fukuzumi ................. | 365/185.03 |
| 6,385,677 B1 | * | 5/2002 | Yao ................................. | 711/115 |
| 2005/0086553 A1 | * | 4/2005 | Spencer ......................... | 713/600 |
| 2005/0140649 A1 | * | 6/2005 | Shudo et al. ................... | 345/158 |
| 2006/0075395 A1 | * | 4/2006 | Lee et al. ....................... | 717/168 |
| 2007/0136616 A1 | * | 6/2007 | Kurakata et al. .............. | 713/300 |
| 2008/0215801 A1 | * | 9/2008 | Tan et al. ....................... | 711/103 |

FOREIGN PATENT DOCUMENTS

| | | |
|---|---|---|
| JP | 2-101692 | 4/1990 |
| JP | 3-296986 | 12/1991 |
| JP | 9-305497 | 11/1997 |
| JP | 10-106279 | 4/1998 |
| JP | 10-240633 | 9/1998 |
| JP | 11-31102 | 2/1999 |
| JP | 11-134884 | 5/1999 |
| JP | 2001-306393 | 11/2001 |
| JP | 2002-16154 | 1/2002 |
| JP | 2003-22687 | 1/2003 |
| JP | 2003-36693 | 2/2003 |
| JP | 2003-114826 | 4/2003 |

(Continued)

OTHER PUBLICATIONS

"NAND vs. NOR Flash Memory Technology overview", Toshiba America.*
Office Action issued May 31, 2011, in Japanese Patent Application No. 2006-028563 with English translation.

(Continued)

*Primary Examiner* — Edward Dudek, Jr.
(74) *Attorney, Agent, or Firm* — Oblon, Spivak, McClelland, Maier & Neustadt, L.L.P.

(57) ABSTRACT

A semiconductor memory device includes a first nonvolatile memory which has a first external interface and is capable of recording 1-bit data in one memory cell, a second nonvolatile memory which has a test terminal interface and is capable of recording a plurality of data in one memory cell, and a control unit which has a second external interface and is configured to control a physical state of an inside of the second nonvolatile memory.

20 Claims, 15 Drawing Sheets

FOREIGN PATENT DOCUMENTS

| | | |
|---|---|---|
| JP | 2004-228323 | 8/2004 |
| JP | 2004-272476 | 9/2004 |
| JP | 2004-326867 | 11/2004 |
| JP | 2005-536826 | 12/2005 |
| JP | 2006-66009 | 3/2006 |

OTHER PUBLICATIONS

Office Action (with English translation) issued on Jul. 5, 2011, in counterpart Japanese Application No. 2006-014131 (6 pages).

* cited by examiner

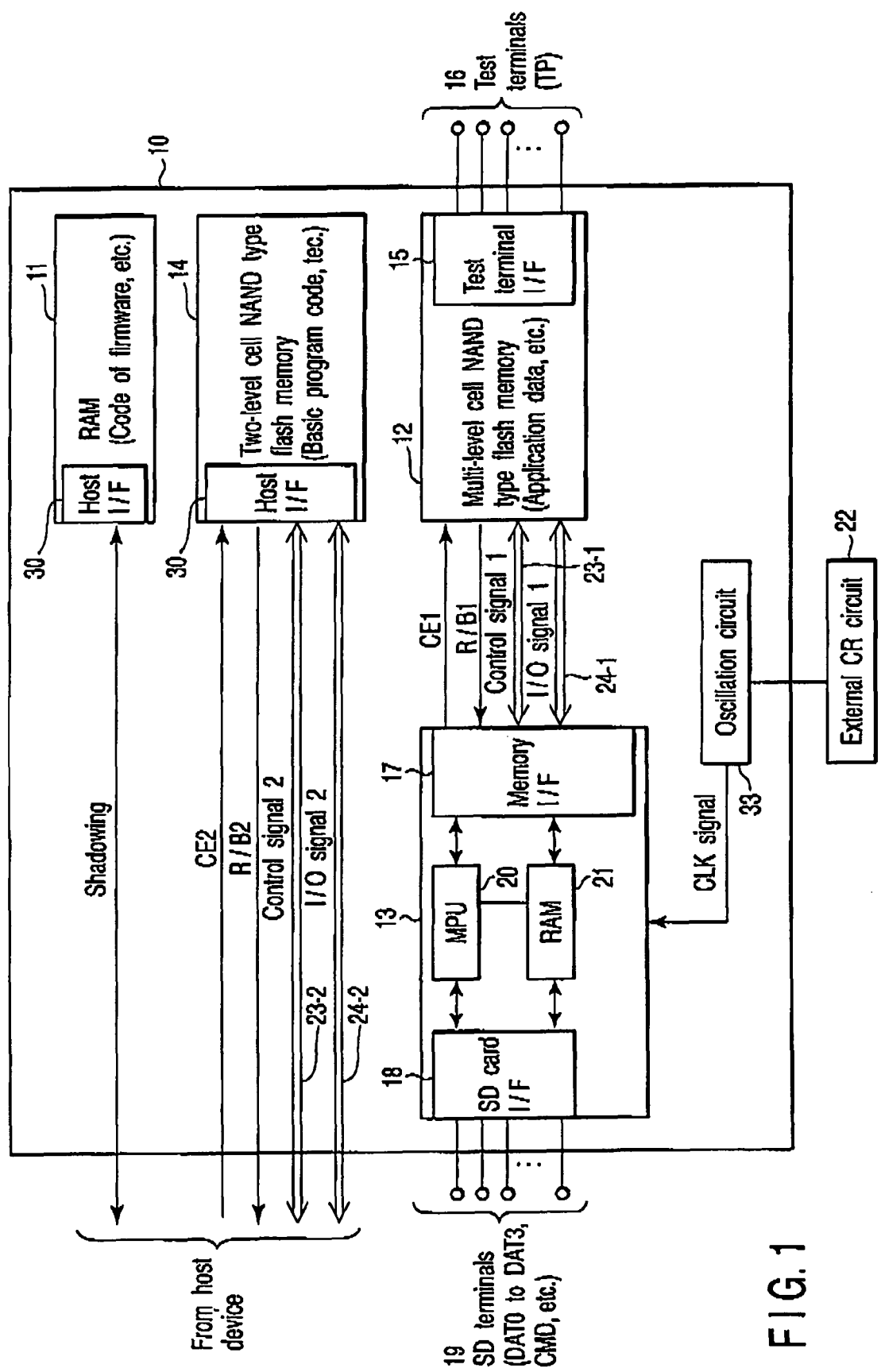
F I G. 1

| Pin No. | Signal |
|---|---|
| DAT0 | Data 0/CARD detection signal |
| DAT1 | Data 1 |
| DAT2 | Data 2 |
| DAT3 | Data 3 |
| Vss | Power supply voltage |
| Vdd | Ground voltage |
| TP | Test signal |
| CLK | Clock signal |
| X1~X3 | Oscillation signal |
| CMD | Command |
| NU | Non-used |

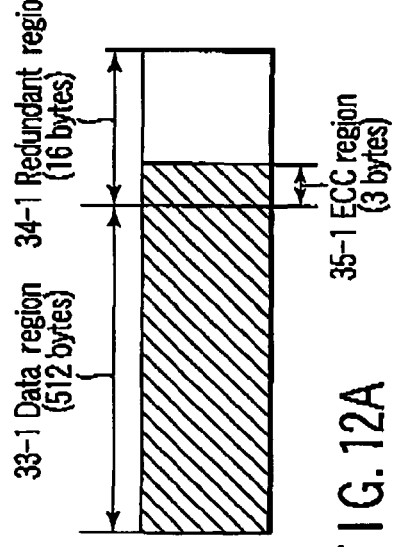
F I G. 12A
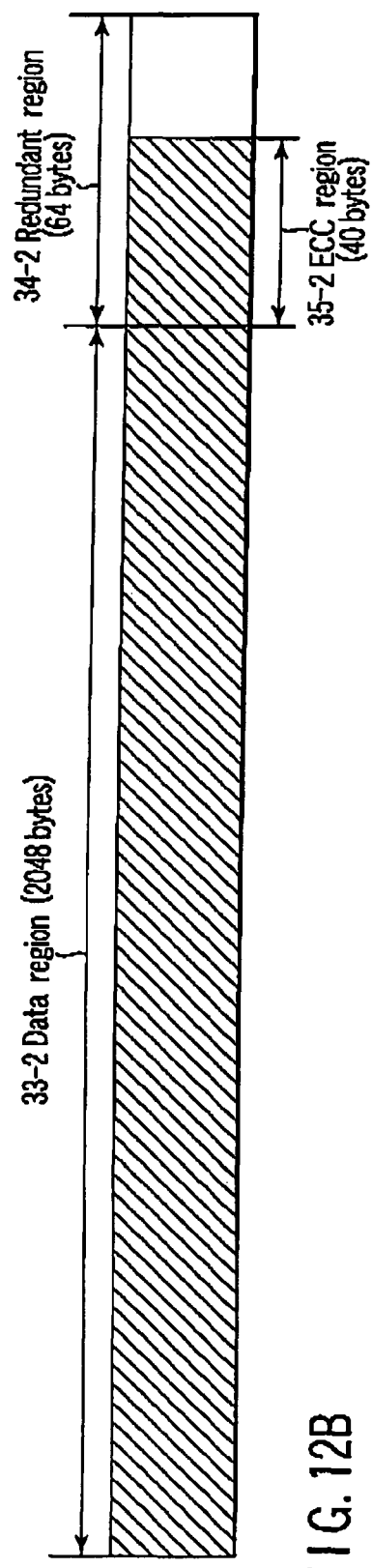
F I G. 12B

|   | 1 | 2 | 3 | 4 | 5 | 6 | 7 | 8 | 9 | 10 | 11 | 12 |
|---|---|---|---|---|---|---|---|---|---|----|----|----|
| A | NC | NC | NC |   |   | 15 SDRAM I/F |   |   |   | NC | NC | NC |
| B | NC | NC | NC |   |   |   |   |   |   | NC | NC | NC |
| C | NC | NC | NC | VDD | VSS | NC | NC | VDD | VSS | I/O7 | NC | NC |
| D | NC | NC | NC | A0 | NC | CLK | CKE | A7 | A8 | I/O6 | NC | NC |
| E |    | NC | R/B | A1 | BA0 | WEA | A12/NC | A6 | NC | I/O5 | NC |   |
| F |    | NC | RE | A2 | BA1 | CAS | A11 | A5 | NC | I/O4 | NC |   |
| G |    | VSS | CE | A3 | A10 | RAS | A9 | A4 | NC | NC | NC |   |
| H |    | VCC | NC | NC | D0 | D1 | D2 | D3 | NC | VSS | VCC |   |
| I |    | VDD | NC | NC | CLK | NC | CMD | NC | NC | NC | VDD |   |
| J |    | NC | CLE | NC | NC | UDQM | LDQM | NC | NC | I/O3 | NC |   |
| K |    | NC | ALE | D0 | D3 | NC | NC | D10 | D13 | I/O3 | NC |   |
| L |    | NC | WE | D1 | D4 | D6 | D8 | D11 | D14 | I/O2 | NC |   |
| M |    | NC | WP | D2 | D5 | D7 | D9 | D12 | D15 | I/O1 | NC |   |
| N | NC | NC | NC | VDDQ | VSSQ | VDD | VSS | VDDQ | VSS | I/O0 | NC | NC |
| O | NC | NC | NC |   |   |   |   |   |   | NC | NC | NC |
| P | NC | NC | NC |   |   | 15 SDRAM I/F |   |   |   | NC | NC | NC |

16 NAND I/F

18 SD card I/F

| Interface | Pin No. | Signal |
|---|---|---|
| SD card I/F | D0 | Data 0/card detection signal |
| | D1 | Data 1 |
| | D2 | Data 2 |
| | D3 | Data 3 |
| | VDD,VCC | Power supply voltage |
| | VSS | Ground voltage |
| | CMD | Command |
| | CLK | Clock signal |
| | NC | Open |

FIG. 15

| Interface | Pin No. | Signal |
|---|---|---|
| NAND I/F | I/O0 ~ I/O7 | Data, address, command |
| | VSS | Ground voltage |
| | R/B | Ready/busy signal |
| | CE | Chip enable signal |
| | RE | Read enable signal |
| | CLE | Command latch enable signal |
| | ALE | Address latch enable signal |
| | WE | Write enable signal |
| | WP | Write protect signal |
| | NC | Open |

FIG. 16

| Interface | Pin No. | Signal |
|---|---|---|
| SDRAM I/F | D0 ~ D15 | Data |
| | VSS | Ground voltage (core) |
| | VSSQ | Ground voltage (I/O) |
| | VDD | Power supply voltage (core) |
| | VDDQ | Power supply voltage (I/O) |
| | VDQM | Data mask & output enable signal |
| | LDQM | Data mask & output enable signal |
| | A0 ~ A12 | Address signal |
| | BA0,BA1 | Bank signal |
| | CLK | Clock signal |
| | CKE | Clock enable signal |
| | WE | Write control signal |
| | CAS | Column address latch signal |
| | RAS | Row address latch signal |
| | NC | Open |

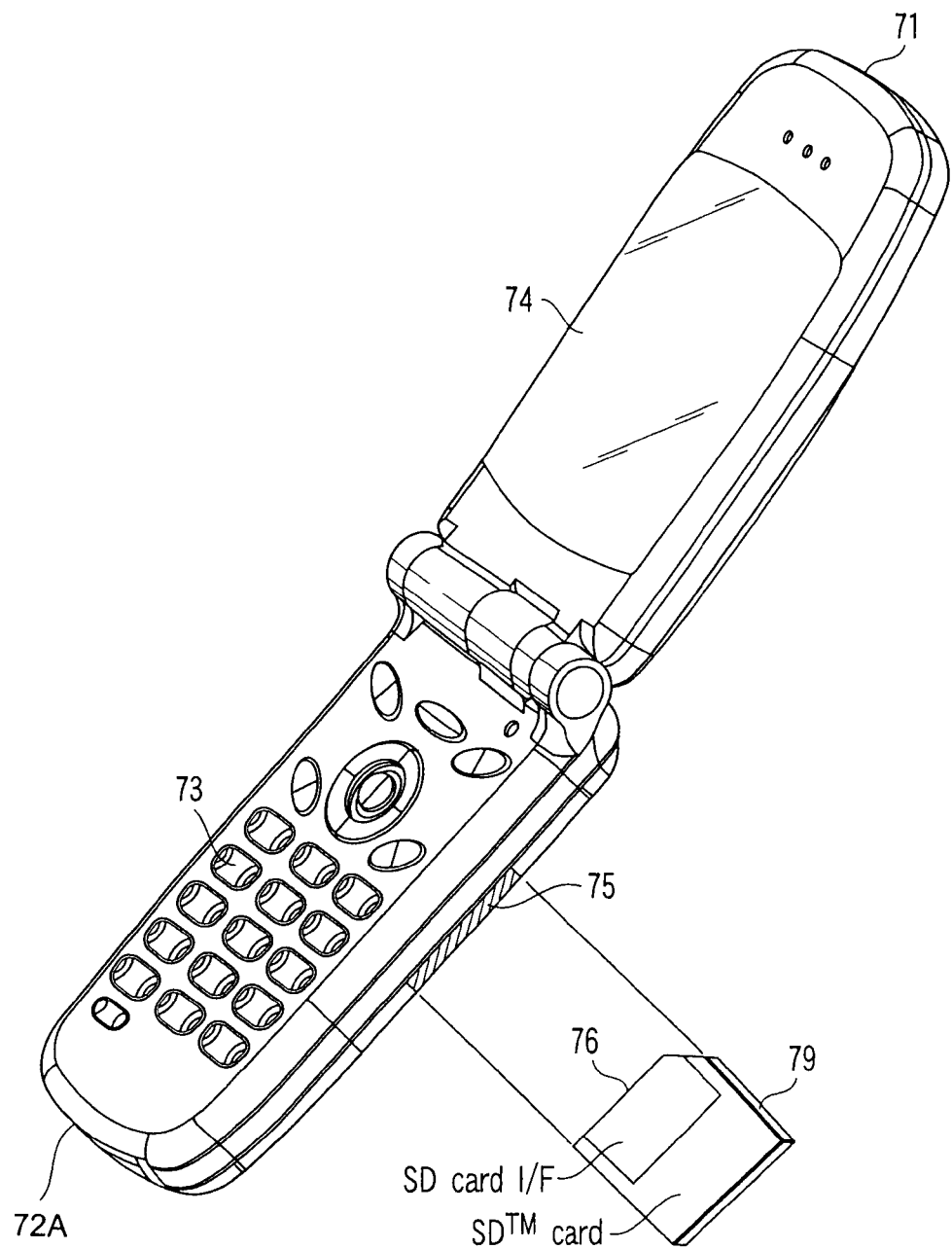
F I G. 18

SEMICONDUCTOR MEMORY DEVICE INCLUDING CONTROL MEANS AND MEMORY SYSTEM

CROSS-REFERENCE TO RELATED APPLICATIONS

This application is based upon and claims the benefit of priority from prior Japanese Patent Applications No. 2006-014131, filed Jan. 23, 2006; and No. 2006-028563, filed Feb. 6, 2006, the entire contents of both of which are incorporated herein by reference.

BACKGROUND OF THE INVENTION

1. Field of the Invention

The present invention relates to a semiconductor memory device, which is used, for example, in a semiconductor chip on which a NAND type flash memory is mounted.

2. Description of the Related Art

Conventionally, nonvolatile memories, which are called "NAND type flash memories", have been used and marketed (see, for instance, Jpn. Pat. Appln. KOKAI Publication No. 2002-016154 and Jpn. Pat. Appln. KOKAI Publication No. 2004-228323).

NAND type flash memories include a two-Level Cell NAND type flash memory, in which 1-bit data can be recorded in one memory cell. Further, NAND type flash memories include a Multi-Level Cell NAND type flash memory, in which a plurality of data can be recorded in one memory cell. Since the Multi-Level Cell NAND type flash memory can record a plurality of data in an area of one memory cell, it is possible to realize double or more the capacity of the two-Level Cell NAND type flash memory having the same area. Thus, with a recent increase in capacity of flash memories, attention has been paid to the Multi-Level Cell NAND type flash memory from the standpoint of reduction in chip area and cost.

However, the Multi-Level Cell NAND type flash memory, compared to the two-Level Cell NAND type flash memory, has the following restrictions 1 to 3 in use:

1. The data write time and data erase time are longer.

There is the following problem. At present, in the Multi-Level Cell NAND type flash memory, the time for writing data in cells is about three times longer than the time for writing data in cells in the two-Level Cell NAND type flash memory. In addition, at present, in the Multi-Level Cell NAND type flash memory, the time for erasing data in cells is about two times longer than the time for erasing data in cells in the two-Level Cell NAND type flash memory.

2. A higher data error correction performance is required.

The two-Level Cell NAND type flash memory is required to have a performance of correcting a 1-bit data error per 512-byte data. On the other hand, the Multi-Level Cell NAND type flash memory is required to have a performance of correcting 4-bit data errors per 512-byte data.

3. The number of executable rewrite operations decreases.

In the two-Level Cell NAND type flash memory, about 100,000 rewrite operations can be executed. In the Multi-Level Cell NAND type flash memory, about 10,000 rewrite operations are possible.

In the NAND type flash memory, in order to avoid concentration of data write in a given memory cell, a technique for dispersing write operations among cells ("Wear Leveling") has been adopted. However, compared to the two-Level Cell NAND type flash memory, higher-level technology is needed to use the Multi-Level Cell NAND type flash memory. Hence, a greater deal of time and cost is required in developing programs, etc. therefor.

In the case where the NAND type flash memory is used as a memory medium, control means needs to be provided for adding an error correction code (ECC) at the time of data input/output control, data management and data write, and for analyzing/processing the error correction code (ECC) at the time of reading out data. In the ordinary Multi-Level Cell NAND type flash memory, such control means is not mounted in the same package. Thus, the user is required to prepare the control means separately.

On the other hand, since there are the above-described restrictions 1, 2 and 3 in use of the Multi-Level Cell NAND type flash memory, a certain level of technology, which can avoid the restrictions 1, 2 and 3 in use, is needed in order to provide the control means.

BRIEF SUMMARY OF THE INVENTION

According to an aspect of the present invention, there is provided a semiconductor memory device comprising: a first nonvolatile memory which has a first external interface and is capable of recording 1-bit data in one memory cell; a second nonvolatile memory which has a test terminal interface and is capable of recording a plurality of data in one memory cell; and control means which has a second external interface and is configured to control a physical state of an inside of the second nonvolatile memory.

According to another aspect of the present invention, there is provided a semiconductor memory device comprising: a bus; a data processing unit which processes received data and sends the processed data to the bus; a data selection unit which receives and selects the data that is sent from the data processing unit via the bus, and outputs the selected data to an outside; and a semiconductor chip including a first nonvolatile memory which has a first external interface and is capable of recording 1-bit data in one memory cell, a second nonvolatile memory which has a test terminal interface and is capable of recording a plurality of data in one memory cell, control means which has a second external interface and is configured to control a physical state of an inside of the second nonvolatile memory, and a processor having an interface which supports a transfer protocol of the bus.

According to still another aspect of the invention, there is provided a memory system comprising: a semiconductor chip including a first nonvolatile memory which has a first external interface and is capable of recording 1-bit data in one memory cell, a second nonvolatile memory which has a test terminal interface and is capable of recording a plurality of data in one memory cell, and control means which has a second external interface and is configured to control a physical state of an inside of the second nonvolatile memory; an external memory device having a third external interface; and a CPU having a fourth external interface which is commonly used with the first external interface and the third external interface.

BRIEF DESCRIPTION OF THE SEVERAL VIEWS OF THE DRAWING

FIG. 1 is a block diagram for describing a semiconductor memory device according to a first embodiment of the present invention;

FIG. 12A shows a unit memory area of a two-Level Cell NAND type flash memory according to the fourth embodiment;

FIG. 12B shows a unit memory area of a Multi-Level Cell NAND type flash memory according to the fourth embodiment;

FIG. 13 is a view showing a signal pin arrangement of the semiconductor memory device according to the fourth embodiment;

FIG. 14 is a view showing assignment of signals to signal pins of an SD card I/F of the semiconductor memory device according to the fourth embodiment;

FIG. 15 is a view showing assignment of signals to signal pins of a NAND I/F of the semiconductor memory device according to the fourth embodiment;

FIG. 16 is a view showing assignment of signals to signal pins of an SDRAM I/F of the semiconductor memory device according to the fourth embodiment;

FIG. 18 is a view showing a mobile phone including a memory system according to a sixth embodiment of the invention.

DETAILED DESCRIPTION OF THE INVENTION

Figure 2:
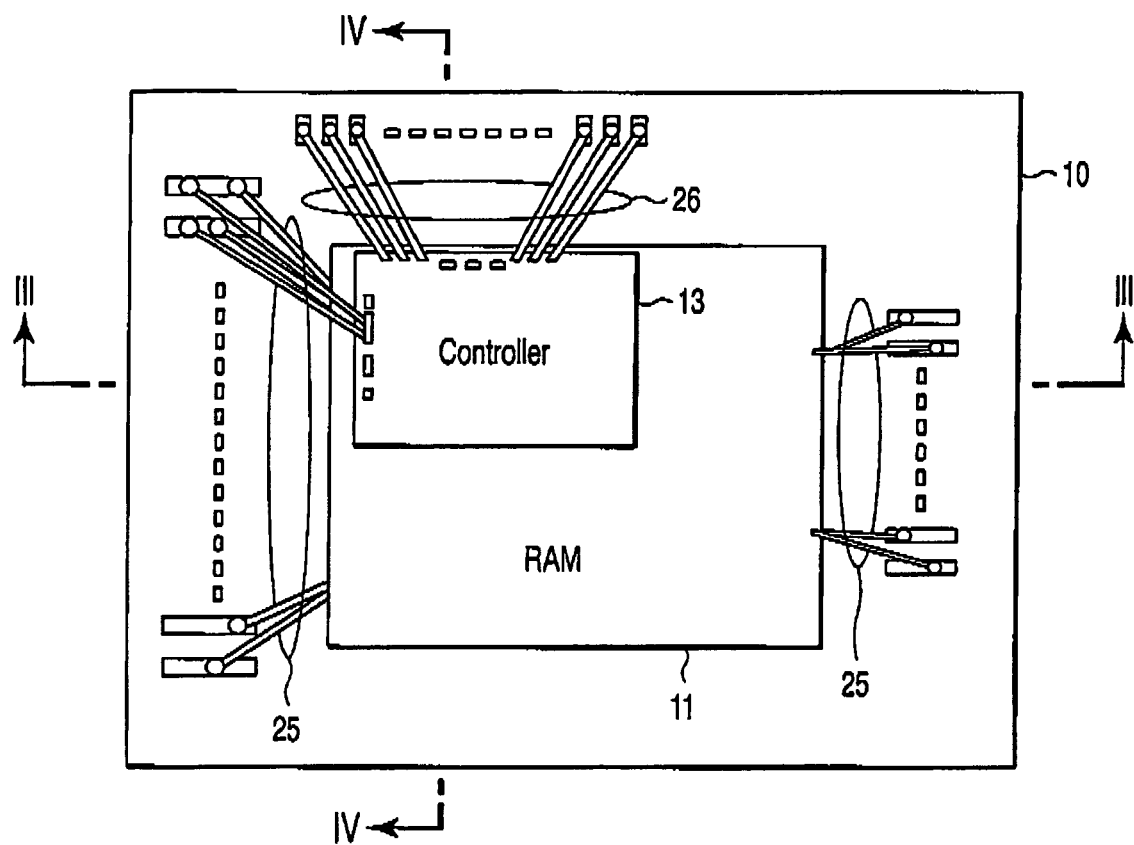
FIG. 2 is a plan view showing a plan-view structure of the semiconductor memory device according to the first embodiment.

Embodiments of the present invention will now be described with reference to the accompanying drawings. In the description below, common parts are denoted by like reference numerals throughout all the drawings.

First Embodiment

A semiconductor memory device according to a first embodiment of the invention is described with reference to FIG. 1 to FIG. 7. FIG. 1 is a block diagram for describing the semiconductor memory device according to this embodiment. In this embodiment, a multi-chip package (MCP), in which a plurality of NAND type flash memories 12, 14 are mounted on a single semiconductor chip 10, is described by way of example. The MCP is used, for example, as a memory of a mobile phone.

As shown in FIG. 1, in the semiconductor chip 10, a RAM (Random Access Memory) 11, a Multi-Level Cell NAND type flash memory 12, a controller (control means) 13, a two-Level Cell NAND type flash memory 14 and an oscillation circuit 33 are mounted within a single package. The semiconductor chip 10 is mounted on a printed circuit board by soldering, and executes data transfer with a host device on a system such as a mobile phone (not shown).

The RAM 11 is configured such that when the host device uses program code such as firmware, such program code is temporarily expanded (stored) in the RAM 11 ("shadowing"). Unlike a NOR type flash memory, the NAND type flash memory 14, as in this embodiment, cannot be accessed by designating addresses. Data is serially read out of the NAND type flash memory 14. Thus, when the host device reads in program code such as firmware, such program code needs to be temporarily expanded in the RAM 11 so as to permit random access. The RAM 11 should preferably be, for instance, an SDRAM which has a larger capacity than a pseudo static RAM (pseudo SRAM).

The Multi-Level Cell NAND type flash memory 12 is a NAND type flash memory which can store multi-bit plural data in one memory cell, and has a test terminal interface (test terminal I/F) 15. The Multi-level Cell NAND type flash memory 12 is controlled by the controller 13. The Multi-Level Cell NAND type flash memory 12 executes data transmission/reception with the host device via an SD card I/F 18 that is provided in the controller 13.

The two-Level Cell NAND type flash memory 14 is a NAND type flash memory which can store 1-bit data in one memory cell. The two-Level Cell NAND type flash memory 14 executes direct transmission/reception of commands, data, etc. with the host device.

In addition, test terminals 16 (signal pins TP), which are electrically connected to the test terminal I/F 15 and are led out of the semiconductor chip 10, are provided. The test terminals 16 are provided in order to enable a manufacturer to perform a function test for checking whether the Multi-Level Call NAND type flash memory 12 functions normally, for example, at the time of shipping of the manufactured semiconductor chip 10.

The controller 13 is configured to manage the operation of the Multi-level Cell NAND type flash memory 12 (e.g. which of sequential logic sector address data is stored at which of physical block addresses, or which block is in the erased state). In addition, the controller 13 executes data input/output control, manage the data, adds an error correction code (ECC) at the time of data write operation to the Multi-level Cell NAND type flash memory 12, and executes analysis and error correction at the time of data read operation from the Multi-level Cell NAND type flash memory 12.

The controller 13 includes a memory interface (NAND I/F in this example) 17, an SD card I/F 18, an MPU (Micro-Processing Unit) 20 and a RAM (Random Access Memory) 21.

The memory I/F 17 is provided for exchange of data, control signals, etc. with the Multi-Level Cell NAND type flash memory 12.

The SD card I/F 18 is provided for data transfer between the controller 13 and the host device (not shown). The SD card I/F 18 is a host interface that is formed on the basis of an SD™ memory card.

In addition, SD card interface terminals 19 (signal pins DAT0 to DAT3, CMD, etc.), which are electrically connected to the SD card I/F 18 and are led out of the semiconductor chip 10, are provided.

The MPU 20 is configured to control the operation of the entirety of the Multi-Level Cell NAND type flash memory 12. The MPU 20 receives write commands, read commands and erase commands from the host device (not shown), executes predetermined processes for the Multi-Level Cell NAND type flash memory 12, and controls a data transfer process via the RAM 21.

The RAM 21 within the controller 13 is configured to temporarily store a predetermined amount of data (e.g. 1-page data), for example, when data sent from the host device is to be written in the Multi-Level Cell NAND type flash memory 12.

The oscillation circuit 33 is configured to generate a clock signal (CLK signal) and to send the clock signal to the controller 13. The external CR circuit 22 is configured to determine the oscillation frequency of the clock signal.

The signals, which are described below, are transmitted/received between the controller 13 and the Multi-level Cell NAND type flash memory 12, or between the host device and the 2-level Cell NAND type flash memory 14.

A READY/BUSY signal (hereinafter referred to as "R/B1 signal", "R/B2 signal") is a signal for indicating the internal operation state of the memory 12, 14 to the outside. While the memory 12, 14 is executing an operation, the memory 12, 14 sends the R/B1 signal, R/B2 signal, which represents "BUSY state". On the other hand, when the memory 12, 14 completes the operation, the memory 12, 14 sends the R/B1 signal, R/B2 signal, which represents "READY state".

The R/B1 signal is independently transmitted/received between the Multi-Level Cell NAND type flash memory 12 and the controller 13. The R/B2 signal is independently transmitted/received between the two-value NAND type flash memory 14 and the host device (not shown).

A chip enable signal CE1, CE2 is a mode select signal of the NAND type flash memory 12, 14, and is sent from the controller 13 or host device (not shown). For example, if the chip enable signal CE1 is set at "H level", the NAND type flash memory 12 makes a transition to the standby mode in which read/write is disabled. If the chip enable signal CE2 is set at "L level", the NAND type flash memory 14 makes a transition to the operation mode in which read/write is enabled.

A control signal is a signal for determining whether a signal, which is sent to the NAND type flash memory 12, 14, is an address, a command, or data. The control signal is transmitted/received by a terminal 23-1, 23-2.

An I/O signal is a signal of a command, an address and data. The I/O signal is transmitted/received over I/O bus 24-1, 24-2.

<Read/Write Operation>

The read/write operations of the NAND type flash memories 12, 14 in the present embodiment are executed as follows, using the above-described signals.

The write operation of the two-Level Cell NAND type flash memory 14 is described by way of example. The write operation for the two-Level Cell NAND type flash memory 14 is executed by transactions between the host device and the two-Level Cell NAND type flash memory 14. To start with, the host device confirms that the signal CE2 is at "L level" (operation mode) and the signal R/B2 is in "READY state".

Then, the host device transmits the I/O signal 2, which is composed of an address, a write command and desired data, to the memory 14 over the I/O bus 24-2. Upon receiving the I/O signal 2, the memory 14 sends the R/B2 signal representing "BUSY state" to the host device.

If the data write is completed, the memory 14 sends the R/B2 signal representing "READY state" to the host device. Thus, the write operation is completed.

The data, which is written in the two-Level Cell NAND type flash memory 14, is basic program code, which requires reliability, and partial application data, which requires a read/write performance. Thus, the data that requires reliability is stored in the two-value NAND type flash memory 14.

The write operation for the Multi-Level Cell NAND type flash memory 12 is performed in the same manner as described above, except that the write operation is executed through the controller 13. The data, which is written in the Multi-Level Cell NAND type flash memory 12, is ordinary application data such as music data and video data. Thus, the data that requires a large capacity is stored in the Multi-Level Cell NAND type flash memory 12.

On the other hand, the read operation for the two-Level Cell NAND type flash memory 14 is executed by transactions between the host device and the two-Level Cell NAND type flash memory 14. To start with, the host device confirms that the signal CE2 is at "L level" (operation mode) and the signal R/B2 is in "READY state".

Then, the host device transmits the I/O signal 2, which is composed of an address and read command, to the memory 14 over the I/O bus 24-2. Upon receiving the I/O signal 2, the memory 14 sends the R/B2 signal representing "BUSY state" to the host device.

If the data read from the memory 14 is completed, the memory 14 sends the R/B2 signal representing "READY state" to the host device. Thus, the read operation is completed.

The read operation for the Multi-Level Cell NAND type flash memory 12 is performed in the same manner as described above, except that the read operation is executed through the controller 13.

Further, of the data that is read out of the two-Level Cell NAND flash memory 14 by the read operation, the host device temporarily expands (stores) ("shadowing") data which requires random access, such as code of firmware, in the RAM 11. The host device reads out predetermined data from the RAM 11.

Figure 3:
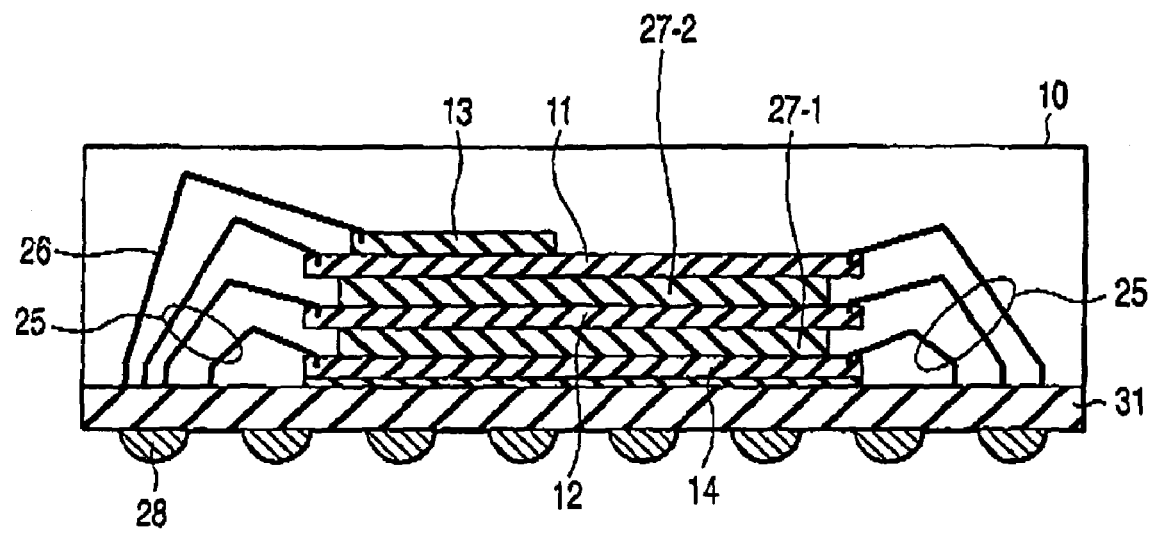
FIG. 3 is a cross-sectional view taken along line III-III in FIG. 2.
Figure 4:
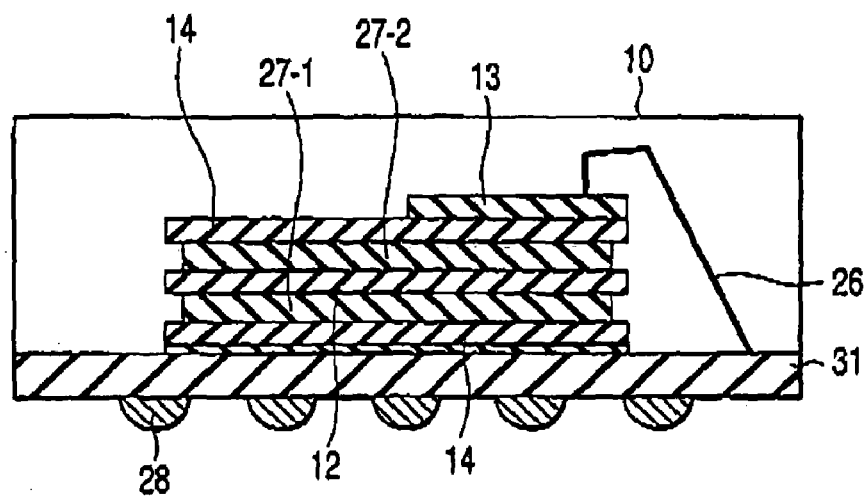
FIG. 4 is a cross-sectional view taken along line IV-IV in FIG. 2.

Next, referring to FIG. 2 to FIG. 4, a plan-view structure and a cross-sectional structure of the semiconductor chip 10 will be described in greater detail. FIG. 2 is a plan view of the semiconductor memory device according to this embodiment. FIG. 3 is a cross-sectional view taken along line III-III in FIG. 2. FIG. 4 is a cross-sectional view taken along line IV-IV in FIG. 2.

As shown in the Figures, in the semiconductor chip 10, a two-Level Cell NAND type flash memory 14, a spacer 27-1, a Multi-Level Cell NAND type flash memory 12, a spacer 27-2, a RAM 11 and a controller 13, which are successively stacked on a substrate 31, are mounted within the same package.

The RAM 11 is bonded to the substrate 31 by wires 25, electrically connected to signal pins (host I/F 30) (to be described later) provided on the back surface of the substrate 31, and mounted via solder balls 28.

The Multi-Level Cell NAND type flash memory 12 is bonded to the substrate 31 by wires 25, electrically connected to signal pins (TP) (to be described later) provided on the back surface of the substrate 31, and mounted via solder balls 28.

The two-Level Cell NAND type flash memory 14 is bonded to the substrate 31 by wires 25, electrically connected to signal pins (host I/F 30) (to be described later) provided on the back surface of the substrate 31, and mounted via solder balls 28.

The controller 13 is bonded to the substrate 31 by wires 26, electrically connected to signal pins (DAT0 to DAT3, CMD, etc.) (to be described later) provided on the back surface of the substrate 31, and mounted via solder balls 28.

Figure 5:
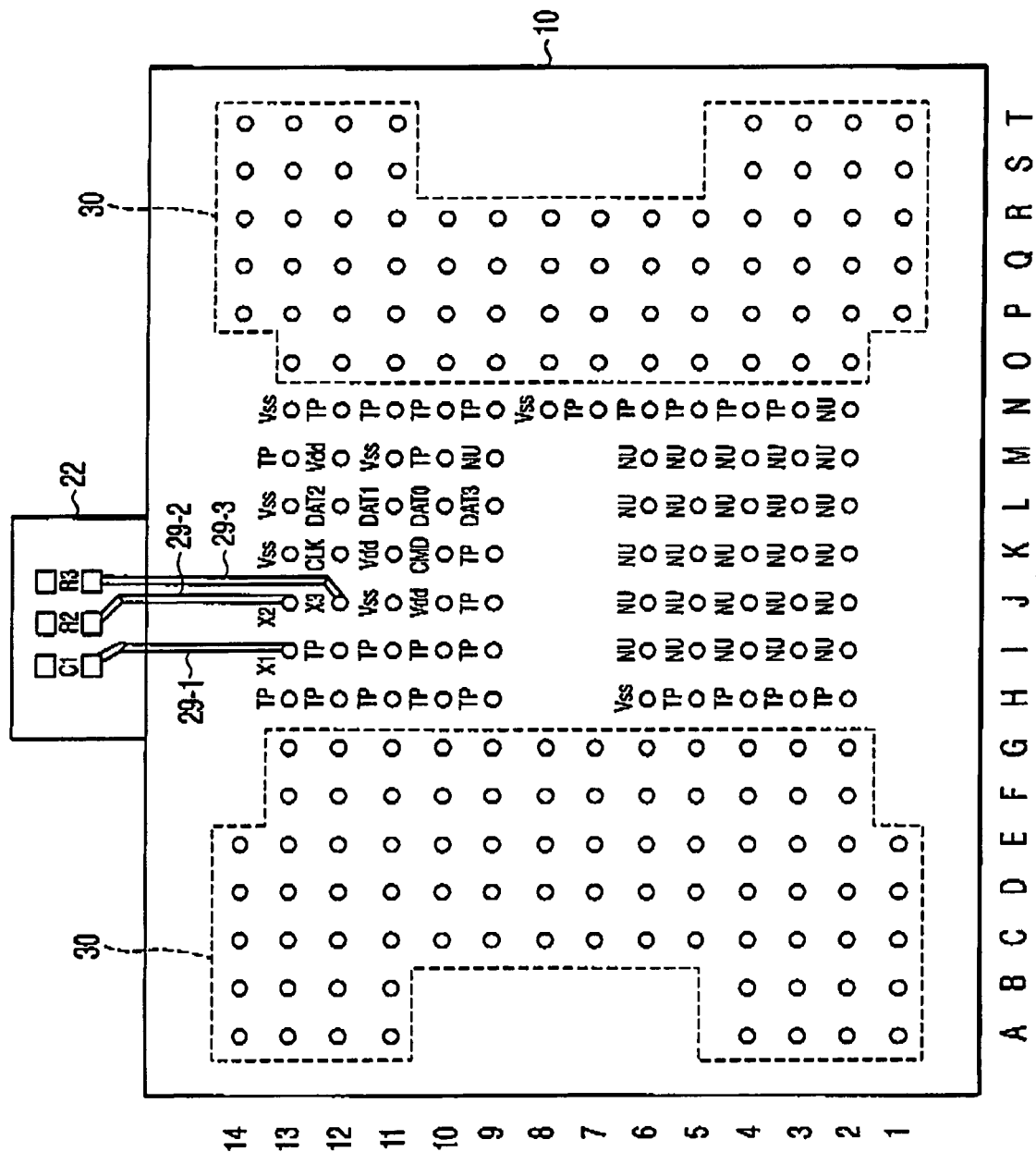
FIG. 5 is a plan view showing a signal pin arrangement of the semiconductor memory device according to the first embodiment.
Figures 6, 7:
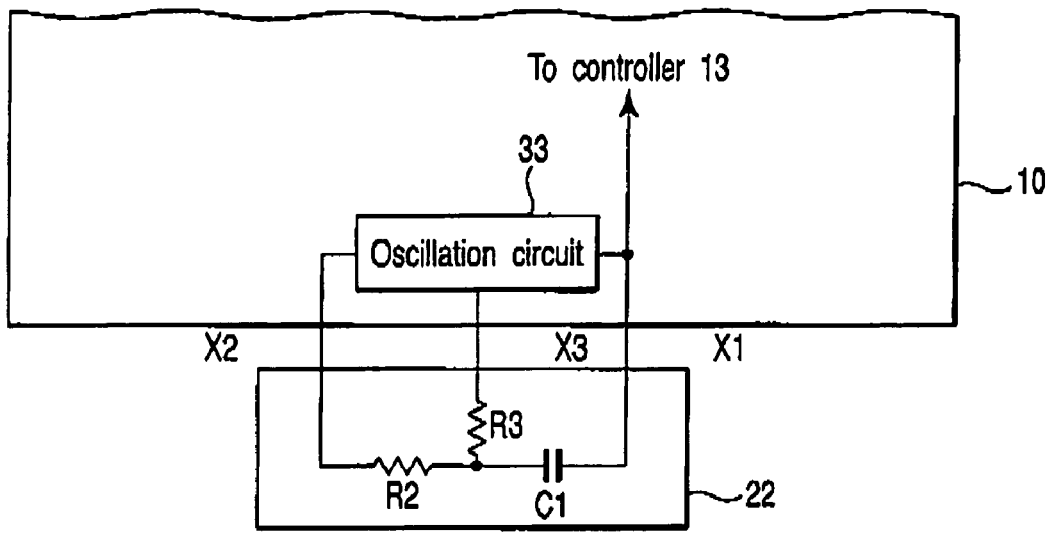
FIG. 6 is a circuit diagram showing an external CR circuit of the semiconductor memory device according to the first embodiment.
FIG. 7 is a view showing assignment of signals to signal pins of the semiconductor memory device according to the first embodiment.

Next, referring to FIG. 5 to FIG. 7, a description is given of the arrangement of signal pins, assignment of signals, and the external CR circuit 22. FIG. 5 is a plan view showing an example of the signal pin arrangement on the back surface of the semiconductor chip. FIG. 6 is a circuit diagram showing an example of the structure of the external CR circuit 22. FIG. 7 is a view for explaining the assignment of signals.

In this example, a plurality of signal pins (DAT0, etc.) are provided on the back surface of the semiconductor chip 10 according to the arrangement shown in FIG. 5. Of the signal pins shown in FIG. 5, the pins of the SD card I/F 18 are signal pins DAT0 to DAT3, Vss, Vdd, CLK and CMD. The host interfaces of the two-Level Cell NAND type flash memory 14 and the RAM 11 have signal pins which are surrounded by broken lines 30 in FIG. 5.

As shown in the Figures, signal pins X1, X2 and X3 for the external CR circuit 22 are arranged at positions (I, 13), (J, 13) and (J, 12) near one side of the back surface of the semiconductor chip 10. The signal pins X1, X2 and X3 are connected to signal pins C1, R2 and R3 of the external CR circuit 22 by signal lines 29-1, 29-2 and 29-3.

The oscillation circuit 33 generates a clock signal (CLK signal) and sends the clock signal to the controller 13. The output of the oscillation circuit 33 is connected to the controller 13. The oscillation circuit 33 is composed of, e.g. an inverter.

The external CR circuit 22 includes resistor elements R2 and R3 and a capacitor C1. The oscillation frequency of the clock signal is determined by choosing and setting the resistance values of the resistor elements R2 and R3 and the capacitance value of the capacitor C1 at predetermines values. One of the electrodes of the capacitor C1 is connected to the output of the oscillation circuit 33, and the other electrode is connected to one end of the resistor element R2 and one end of the resistor element R3. The other ends of the resistor elements R2 and R3 are connected to the input of the oscillation circuit 33.

Signals are assigned to the above-described signal pins, for example, as shown in FIG. 7.

The signal pins DAT0, DAT1, DAT2 and DAT3 are assigned to data 0 to data 3. The signal pin DAT0 is also assigned to the card detection signal.

The signal pin Vss is assigned to a ground voltage, and the signal pin Vdd is assigned to a power supply voltage. The signal pins TP (test terminals 16) are assigned to the test signals. The signal pin CLK is assigned to the clock signal. The signal pins X1 to X3 are connected to the signal pins C1, R2 and R3 of the external CR circuit 22. Signal pins NU are non-used signal pins.

According to the semiconductor memory device of the present embodiment, the following advantageous effects (1) to (4) are obtained.

(1) The Multi-Level Cell NAND type flash memory (i.e. nonvolatile memory in which plural data can be recorded in one memory cell) 12 can easily be used.

As described above, in the conventional semiconductor memory device, the control means, which is so configured as to control the Multi-Level Cell NAND type flash memory, is not mounted in the same package. The user has to prepare the control means separately. In the semiconductor memory device of this embodiment, however, the controller (control means) 13, which is adapted to control the Multi-Level Cell NAND type flash memory 12, is mounted in advance in the same semiconductor chip 10. Thus, the user can use the Multi-Level Cell NAND type flash memory 12 as a memory medium, without taking care of the restrictions 1, 2, and 3 in use of the Multi-Level Cell NAND type flash memory.

Thus, the invention is advantageous in that the user does not have to take care of the restrictions relating to the Multi-Level Cell NAND type flash memory, and that the user can easily use the Multi-Level Cell NAND type flash memory 12 (i.e. nonvolatile memory in which plural data can be recorded in one memory cell) as a memory medium.

(2) Usability can be improved.

The semiconductor chip 10 is configured such that the Multi-Level Cell NAND type flash memory 12 and two-Level Cell NAND type flash memory are mounted in the same chip. The data, which is written in the two-Level Cell NAND type flash memory 14, is basic program code which requires reliability, and partial application data which requires a read/write performance. Thus, the data that requires reliability is stored in the two-Level Cell NAND type flash memory 14. On the other hand, the data, which is written in the Multi-Level Cell NAND type flash memory 12, is ordinary application data such as music data and video data. Thus, the data that requires a large capacity is stored in the Multi-Level Cell NAND type flash memory 12.

It is thus possible to selectively store data in one of the two-Level Cell NAND type flash memory 14 and Multi-Level Cell NAND type flash memory 12 on the basis of the reliability of data and the capacity of data. As a result, data storage can selectively be executed in accordance with the kind of data and the purpose of use of data, and usability can advantageously be improved.

Furthermore, the semiconductor chip 10 is configured such that the RAM 11 is mounted in the same chip. Thus, of the data that is read out of the two-value NAND flash memory 14, data that requires random access, such as code of firmware, is temporarily expanded ("shadowing") in the RAM 11. Therefore, predetermined data can be read out of the RAM 11 with high usability.

(3) Manufacturing efficiency can be improved.

As has been described above, there are provided the test terminals 16 (signal pins TP) which are electrically connected to the test terminal I/F 15 of the Multi-Level Cell NAND type flash memory 12 and are led out of the semiconductor chip 10.

With the provision of the test terminals 16 (signal pins TP), a manufacturer is enabled to perform a function test for checking whether the Multi-Level Cell NAND type flash memory 12 normally functions, for example, at the time of shipping of the manufactured semiconductor chip 10. Therefore, a semiconductor chip 10 with a Multi-Level Cell NAND type flash memory 12, which does not normally function, can be discarded at the time of shipping, and the manufacturing efficiency of semiconductor chips 10 can be improved.

(4) Signal delay in the external CR circuit 22 can be prevented.

As has been described above, the signal pins X1, X2 and X3 for the external CR circuit 22 are arranged at positions (I, 13), (J, 13) and (J, 12) near one side of the back surface of the semiconductor chip 10, and the signal pins X1, X2 and X3 are connected to the signal pins C1, R2 and R3 of the external CR circuit 22 by signal lines 29-1, 29-2 and 29-3. Therefore, the wiring length of the signal lines 29-1 to 29-3 can be reduced, and signal delay due to the increase in wiring length can advantageously be prevented.

Second Embodiment

Example in which a Plurality of Multi-Level Cell NAND Type Flash Memories are Mounted Next, a semiconductor memory device according to a second embodiment of the invention is described with reference to FIG. 8. This embodiment relates to an example in which the semiconductor chip 10 includes a plurality of Multi-Level Cell NAND type flash memories 12-1 and 12-2. A detailed description of the parts overlapping with the first embodiment is omitted here.

Figure 8:
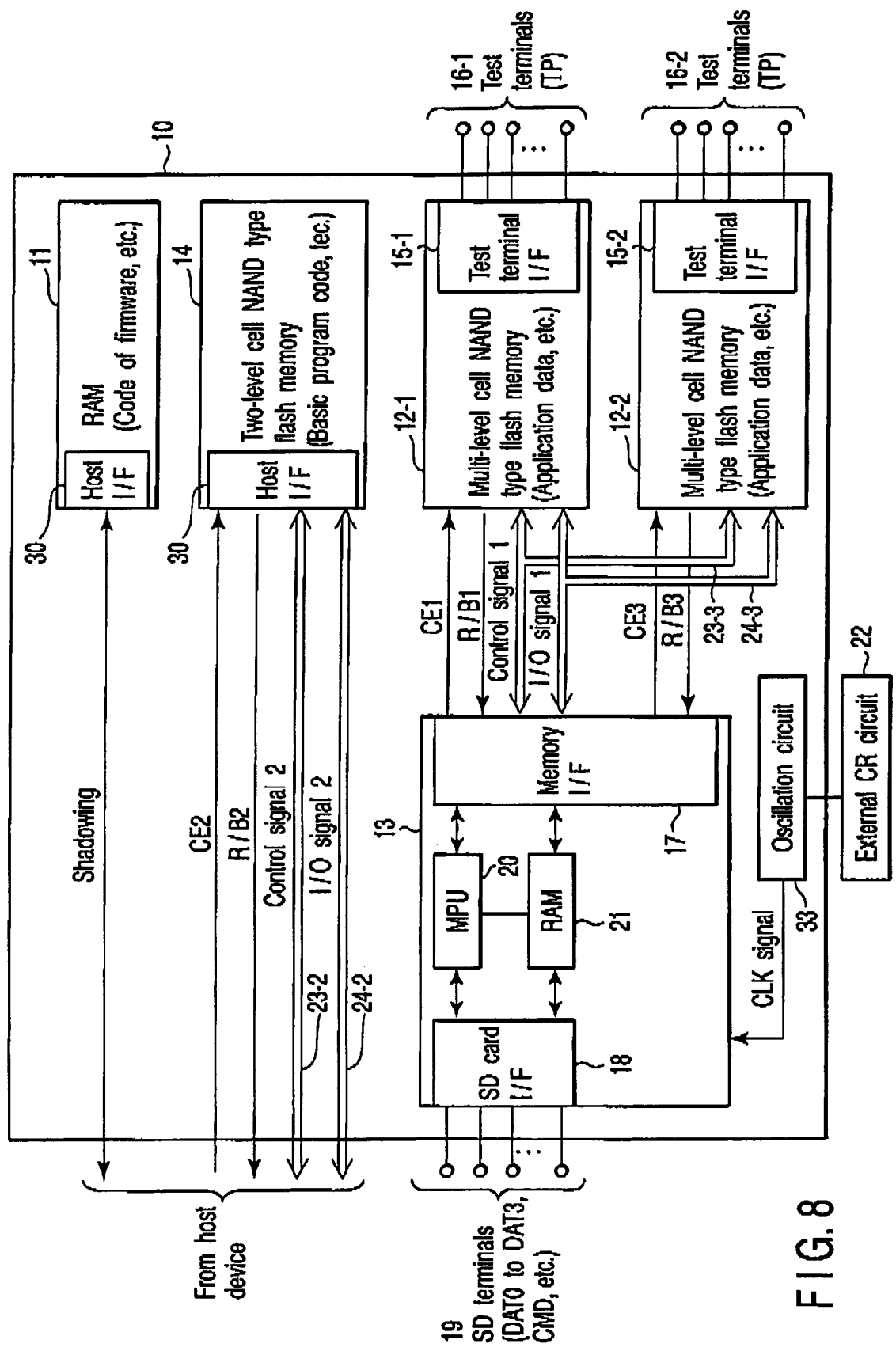
FIG. 8 is a plan view for describing a semiconductor memory device according to a second embodiment of the present invention.

As shown in FIG. 8, the Multi-Level Cell NAND type flash memory 12-2 is further mounted in the same semiconductor chip 10.

The Multi-Level Cell NAND type flash memory 12-2, like the Multi-Level Cell NAND type flash memory 12-1, includes a test terminal I/F 15-2. There are provided test terminals 16-2 (signal pins TP) which are electrically connected to the test terminal I/F 15-2 and are led out of the semiconductor chip 10.

A control signal 1 is transmitted/received between the Multi-Level Cell NAND type flash memories 12-1 and 12-2, on the one hand, and the controller 13, on the other, by a common terminal 23-3.

An I/O signal 1 is transmitted/received between the Multi-Level Cell NAND type flash memories 12-1 and 12-2, on the one hand, and the controller 13, on the other, over a common I/O bus 24-3.

Signals CE1 and CE3 are independently transmitted/received between the Multi-Level Cell NAND type flash memories 12-1 and 12-2, on the one hand, and the controller 13, on the other.

Signals R/B1 and R/B3 are independently transmitted/received between the Multi-Level Cell NAND type flash memories 12-1 and 12-2, on the one hand, and the controller 13, on the other.

Device selection between the Multi-Level Cell NAND type flash memories 12-1 and 12-2 is executed as follows. For example, assume that the Multi-Level Cell NAND type flash memory 12-2 is to be selected.

To start with, the controller confirms that the signals CE1 and CE3 are at "L level" (operation mode) and the signals R/B1 and R/B3 are in "READY state".

Then, the controller 13 sends the signal CE1 representing "H level" to the memory 12-1, and sets the memory 12-1 in the non-selected state (standby mode).

Subsequently, in this state, the write/read operations, as described in connection with the first embodiment, are similarly executed for the memory 12-2.

In this manner, the operation modes of the memories 12-1 and 12-2 are confirmed by the signals R/B1 and R/B3, and then the signals CE1 and CE3 are switched to change the operation modes of the memories 12-1 and 12-2. Thus, the device selection can be executed.

According to the semiconductor memory device of the second embodiment, the same advantageous effects (1) to (4) as with the first embodiment can be obtained.

Further, in the semiconductor chip 10 of this embodiment, the Multi-Level Cell NAND type flash memory 12-2 is further mounted in the same chip. Therefore, the data capacity of the semiconductor chip 10 can advantageously be increased.

The control signal 1 is commonly transmitted/received between the Multi-Level Cell NAND type flash memories 12-1 and 12-2, on the one hand, and the controller 13, on the other, by the common terminal 23-3. The I/O signal 1 is commonly transmitted/received between the Multi-Level Cell NAND type flash memories 12-1 and 12-2, on the one hand, and the controller 13, on the other, over the common I/O bus 24-3. Therefore, the plural Multi-Level Cell NAND type flash memories 12-1 and 12-2 can be controlled by the single controller 13, and the space occupation by the semiconductor chip 10 can advantageously be reduced.

The ordinary application data such as music data and video data, which is to be stored in the Multi-Level Cell NAND type flash memories 12-1 and 12-2, can selectively be stored in one of the Multi-Level Cell NAND type flash memories 12-1 and 12-2. Therefore, such data can advantageously be stored in a further categorized fashion according to the kind and purpose of use of data.

In this embodiment, two Multi-Level Cell NAND type flash memories 12-1 and 12-2 are mounted in the same semiconductor chip 10. However, more than two Multi-Level Cell NAND type flash memories may be mounted in the same semiconductor chip 10. In this case, the memory capacity is further increased, and the data can advantageously be stored in a still further categorized fashion according to the kind and purpose of use of data.

Third Embodiment

Example of Application to STB

A semiconductor memory device according to a third embodiment of the invention is described with reference to FIG. 9. This embodiment relates to an example of a memory system in which the semiconductor chip 10 of the first embodiment is applied to a set-top box (STB). A detailed description of the parts overlapping with the first embodiment is omitted here.

Figure 9:
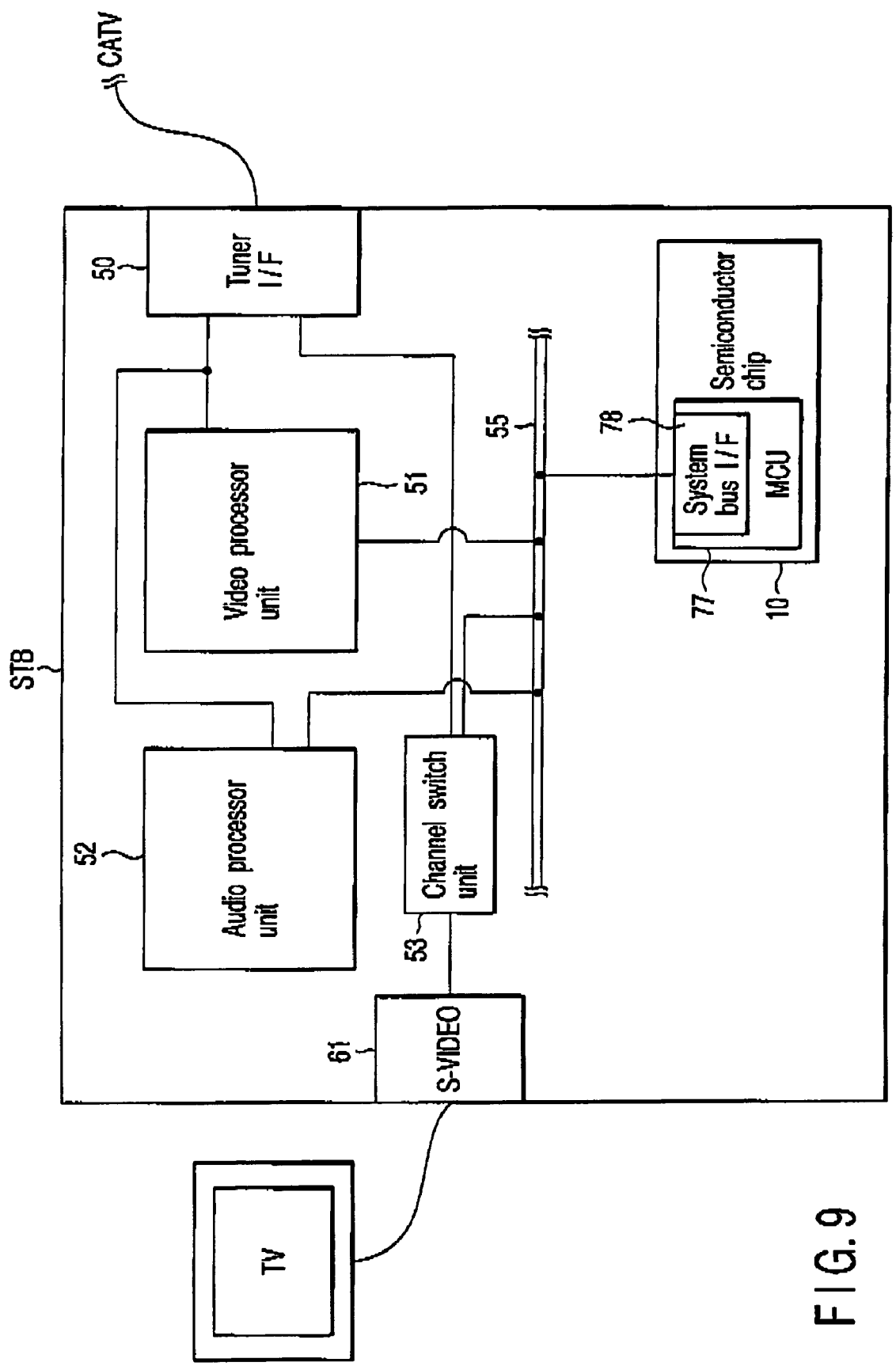
FIG. 9 is a plan view for describing a semiconductor memory device according to a third embodiment of the present invention.

As shown in FIG. 9, the set-top box STB includes a semiconductor chip 10, a tuner I/F (input I/F) 50, a video processor unit 51, an audio processor unit 52, a channel switch unit 53, and an S-VIDEO (output I/F) 61.

The video processor unit 51 receives video data from a cable television CATV via the tuner I/F (input I/F) 50, executes a predetermined process on the video data, and sends the processed video data to a system bus 55.

The audio processor unit 52 receives audio data from the cable television CATV via the tuner I/F (input I/F) 50, executes a predetermined process on the audio data, and sends the processed audio data to the system bus 55.

The channel switch unit 53 receives the video/audio data from the video processor unit 51 and audio processor unit 52 via the system bus 55, selects the video/audio data in accordance with a predetermined channel, and outputs the video/audio data to a television receiver TV via the S-VIDEO (output I/F) 61.

The semiconductor chip 10 functions to store program information such as a program guide, or video/audio data, which are sent from the system bus 55, into the Multi-Level Cell NAND type flash memory 12, or to send the program information such as a program guide, or video/audio data, which are stored in the Multi-Level Cell NAND type flash memory 12, to the system bus 55.

The semiconductor chip 10 of this embodiment differs from that of the first embodiment in that a processor (MCU: Micro-Controller Unit) 77 having a system bus I/F 78 is provided. The system bus I/F 78 is an interface that supports the transfer protocol of the system bus 55.

According to the above structure, the same advantageous effects (1) to (4) as with the first embodiment can be obtained.

Further, in this embodiment, the semiconductor chip 10 includes the processor 77 having the system bus I/F 78 that supports the transfer protocol of the system bus 55. Therefore, the semiconductor chip 10 can advantageously control the video processor unit 51, audio processor unit 52 and channel switch unit 53 via the system bus 55. Moreover, the semiconductor chip 10 can be applied to the STB, where necessary.

If the semiconductor chip 10 of this embodiment is applied to the STB, it becomes possible to store, in the Multi-Level Cell NAND type flash memory 12 with a large memory capacity, record data such as program information, e.g. program guide, and video/audio data, which are expected to increase in volume more and more in the future. Therefore, the memory capacity can advantageously be increased.

In this embodiment, the set-top box STB is exemplified. Additionally, the invention is similarly applicable to mobile phones, digital household electric appliances, etc.

Fourth Embodiment

Figure 10:
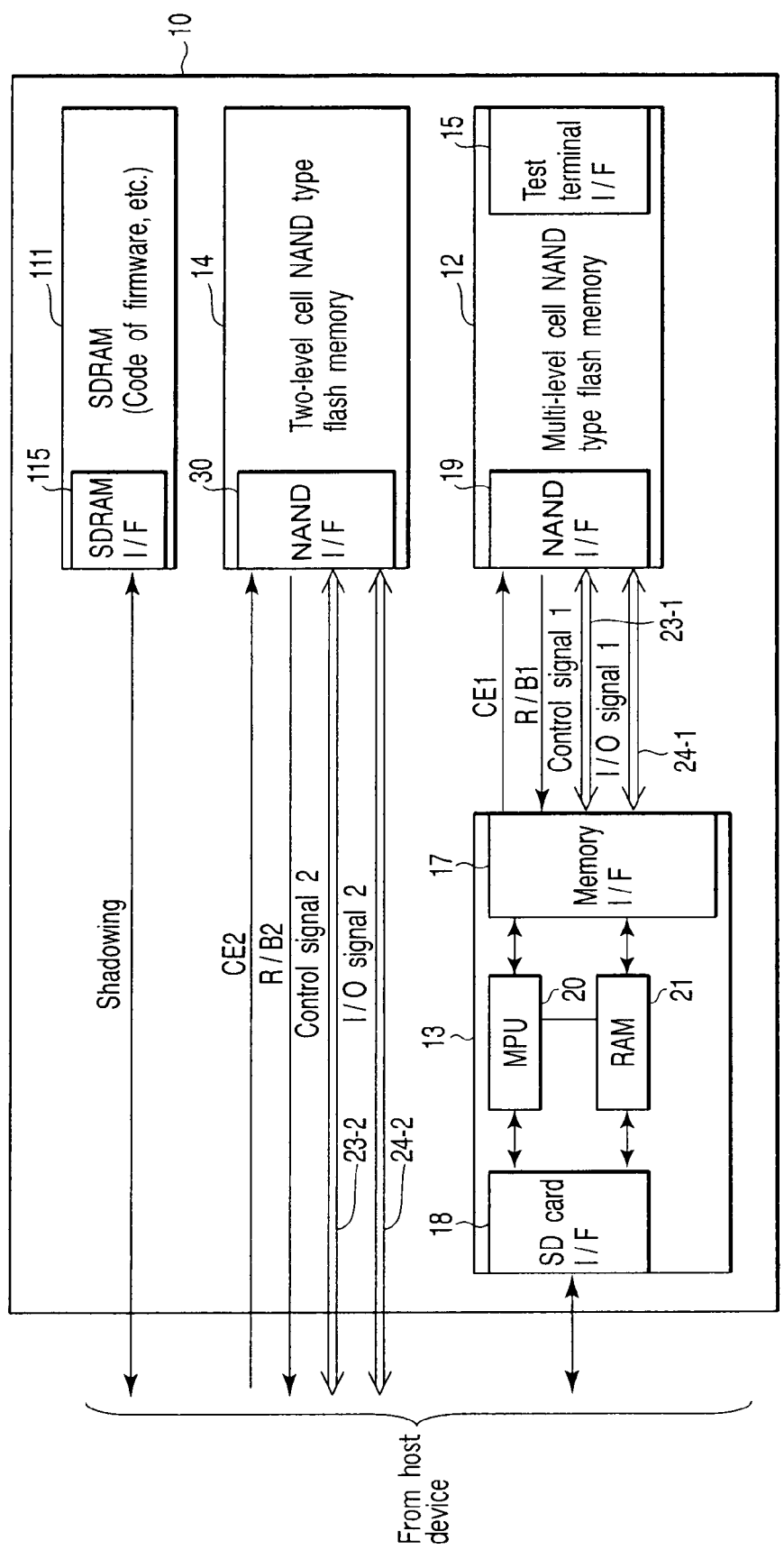
FIG. 10 is a block diagram showing a semiconductor memory device according to a fourth embodiment of the present invention.

Next, referring to FIG. 10 to FIG. 16, a semiconductor memory device according to a fourth embodiment of the invention is described. FIG. 10 is a block diagram for describing the semiconductor memory device according to this embodiment.

This embodiment is a case applies the RAM 11 of the first embodiment to an SDRAM (Synchronous Dynamic Random Access Memory) 111, as shown in FIG. 10.

The SDRAM 111 has an external interface (SDRAM I/F in this example) 115. When the host device uses program code such as firmware, which is read out of the two-Level Cell NAND type flash memory 14, such program code is temporarily expanded (stored) in the SDRAM 111 ("shadowing"). Unlike a NOR type flash memory, the NAND type flash memory 14, as in this embodiment, cannot be random-accessed. Data is serially read out of the NAND type flash memory 14. Thus, when the host device reads in program code such as firmware, such program code needs to be temporarily expanded in the SDRAM 111 so as to permit random access.

Figure 11:
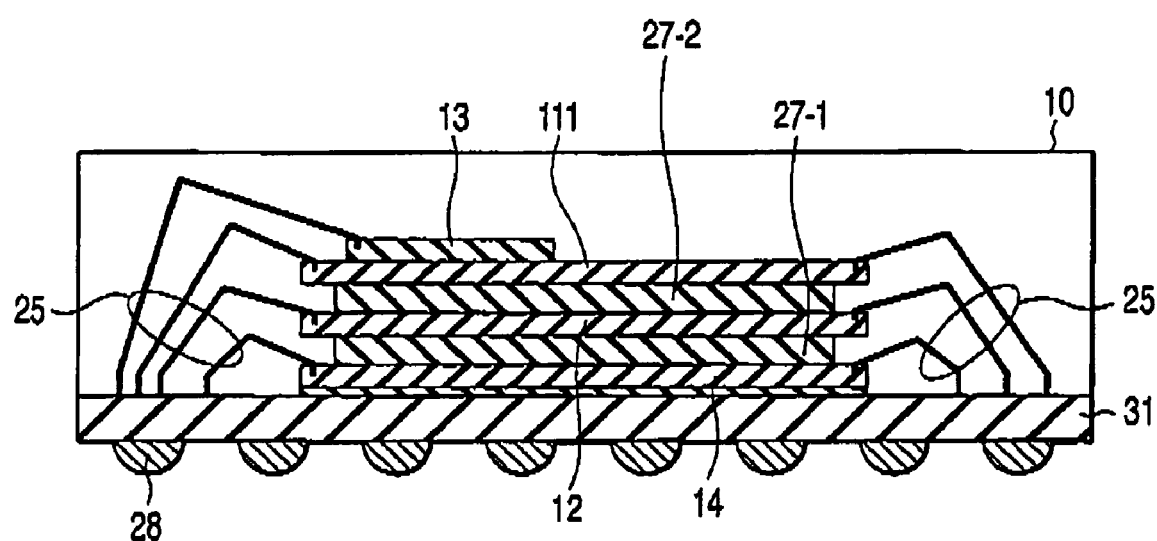
FIG. 11 is a cross-sectional view showing the semiconductor memory device according to the fourth embodiment.

A cross-sectional structure of this embodiment is described with reference to FIG. 11. FIG. 11 is a cross-sectional view showing the semiconductor memory device according to this embodiment.

As shown in FIG. 11, in the semiconductor chip 10, a two-Level Cell NAND type flash memory 14, a spacer 27-1, a Multi-Level Cell NAND type flash memory 12, a spacer 27-2, an SDRAM 111 and a controller 13, which are successively stacked on a substrate 31, are mounted within the same package.

The SDRAM 111 is bonded to the substrate 31 by wires 25, electrically connected to the SDRAM I/F 115 provided on the back surface of the substrate 31, and mounted via solder balls 28.

Next, referring to FIG. 12A and FIG. 12B, a unit memory area (1 page) of each of the two-Level Cell NAND type flash memory 14 and Multi-Level Cell NAND type flash memory 12 according to this embodiment is described. FIG. 12A shows the unit memory area of the two-Level Cell NAND type flash memory 14, and FIG. 12B shows the unit memory area of the Multi-Level Cell NAND type flash memory 12.

The unit memory area (1 page) of the two-Level Cell NAND type flash memory 14, as shown in FIG. 12A, comprises a data region 33-1 (512 Bytes in this example) and a redundant region (16 Bytes) 34-1 that includes an ECC (Error Correcting Code) region 35-1 (3 Bytes).

The unit memory area (1 page) of the Multi-Level Cell NAND type flash memory 12, as shown in FIG. 12B, comprises a data region 33-2 (2048 Bytes in this example) and a redundant region (64 Bytes) 34-2 that includes an ECC region 35-2 (40 Bytes).

As described above, the ratio (about 60% in this example) of the ECC (Error Correcting Code) region 35-2 in the redundant region 34-2 of the Multi-Level Cell NAND type flash memory 12 is set to be greater than the ratio (about 20% in this example) of the ECC region 35-1 in the redundant region 34-1 of the two-Level Cell NAND type flash memory 14. Thus, in the present embodiment, the ratio of the ECC region 35-2 is about three times greater than the ratio of the ECC region 35-1.

Next, referring to FIG. 13 to FIG. 16, the arrangement of signal pins of each interface and the assignment of signals are described. FIG. 13 is a view showing a signal pin arrangement in this embodiment. FIG. 14 to FIG. 16 are views showing assignment of signals to signal pins in this embodiment.

In this example, a plurality of signal pins are provided on the back surface of the semiconductor chip 10 according to the arrangement shown in FIG. 13.

Of the signal pins shown in FIG. 13, the SD card I/F 18 has signal pins D0 to D3, VSS, VDD, VCC, CLK and CMD.

The signal pins D0 to D3 are assigned to data 0 to data 3, respectively. The signal pin D0 is also assigned to a card detection signal. The signal pin VSS is assigned to a ground voltage, and the signal pins VDD and VCC are assigned to power supply voltages. The signal pin CMD is assigned to a command. The signal pin CLK is assigned to a clock signal. The signal pin NU is a non-used signal pin.

The NAND I/F 30 has signal pins I/O0 to I/O7, VSS, R/B, CE, RE, CLE, ALE, WE and WP.

The signal pins I/O0 to I/O7 are assigned to commands, addresses and data. The signal pin R/B is assigned to a ready/busy signal. The signal pin CE is assigned to a chip enable signal. The signal pin RE is assigned to a read enable signal. The signal pin CLE is assigned to a command latch enable signal. The signal pin ALE is assigned to an address latch enable signal. The signal pin WE is assigned to a write enable signal, and the signal pin WP is assigned to a write protect signal.

Of the above-mentioned signals, the read enable signal (RE) signal is a signal for serially outputting data. The command latch enable (CLE) signal is a control signal for controlling input of an operation command to a command register within the device. The address latch enable (ALE) signal is a control signal for controlling input of address data and input data to an address register and a data register within the device. The write enable (WE) signal is a signal for inputting data from the signal pins I/O0 to I/O7 into the device. The write protect (WP) signal is a signal for forcibly prohibiting a write/erase operation.

The SDRAM I/F 115 has signal pins D0 to D15, VSS, VSSQ, VDD, VDDQ, UDQM, LDQM, A0 to A12, BA0, BA1, CLK, CKE, WE, CAS and RAS.

The signal pin VSSQ is assigned to a ground power supply voltage signal. The signal pin VDDQ is assigned to a power supply voltage signal. The signal pin UDQM is assigned to a data mask & output enable signal (upper 8 bits). The signal pin LDQM is assigned to a data mask & output enable signal (lower 8 bits). The signal pins A0 to A12 are assigned to address signals. The signal pins BA0 and BA1 are assigned to bank signals, which are parts of address signals. The signal pin CKE is assigned to a clock enable signal. The signal pin WE is assigned to a write control signal. The signal pin CAS is assigned to a column address strobe signal, and the signal RAS is assigned to a row address strobe signal.

The signal pin VSSQ differs from the signal pin VSS in that the signal pin VSSQ is a signal pin for supplying a ground power supply voltage to a circuit of the input/output system while the signal pin VSS is a signal pin for supplying a ground power supply voltage to a circuit (a circuit of the core system) which is other than the circuit of the input/output system. Similarly, the signal pin VDDQ differs from the signal pin VDD in that the signal pin VDDQ is a signal pin for supplying a power supply voltage to a circuit of the input/output system while the signal pin VDD is a signal pin for supplying a power supply voltage to a circuit (a circuit of the core system) which is other than the circuit of the input/output system.

As described above, the signal pins of ground/power supply voltages are separated between the circuit of the input/output system and the circuit of the other system (i.e. the circuit of the core system). Thereby, output noise, which occurs due to the circuit of the input/output system, is prevented from affecting the circuit of the other system.

Of the above-mentioned signals, the data mask (LDQM) signal controls the lower 8 bits of DQ0-7, and functions as the output control signal in the read cycle and is used to mask the input data in the write cycle. The data mask (UDQM) signal controls the upper 8 bits of DQ8-15, and functions as the output control signal in the read cycle and is used to mask the input data in the write cycle. The bank (BA0, BA1) signal is a signal for designating which bank is associated with an operation. The clock enable (CKE) signal is a signal which is used in order to suspend an internal operation reference clock. The column address strobe (CAS) signal is taken in at a leading edge of the clock, and constitutes, together with the (WE) signal and (RAS) signal, operation commands such as a column access command and a write command. The row address strobe (RAS) signal is taken in at a leading edge of the clock, and constitutes, together with the (WE) signal and (CAS) signal, operation commands such as a bank active command and a precharge command.

As shown in FIG. 13, the signal pins VSS(Q) and VDD(Q) of power supply voltages, or the signal pins VSS and VCC of power supply voltages, are arranged as pairs at neighboring positions. Specifically, these pins are disposed at position (C, 4) and position (C, 5); position (C, 8) and position (C, 9); position (G, 2) and position (H, 2); position (H, 10) and position (H, 11); position (N, 4) and position (N, 5); position (N, 6) and position (N, 7); and position (N, 8) and position (N, 9).

As described above, the signal pins of power supply voltages are arranged as pairs at neighboring positions. Thereby, power supply noise is uniformly produced, and power supply noise is reduced.

A row (row M) of signal pins D2 to D15 is disposed at positions (M, 4), (M, 5), (M, 6), (M, 7), (M, 8) and (M, 9) so as to neighbor, and to be positioned over, a row (row N) of signal pins VSS, etc.

By disposing the row (row M) of signal pins D2 to D15 so as to neighbor, and to be positioned over, the row (row N) of signal pins VSS, etc., the length of wiring (not shown in FIG. 11) for electrically connecting the wires 25 and solder balls 28 is reduced. Thereby, inductance is reduced, and output noise is reduced.

When a function test is performed to check whether the Multi-Level Cell NAND type flash memory 12 normally functions at the time of shipping, any one of the non-used signal pins NC may be used as a signal pin for the test. With the provision of the signal pin for the test, the controller 13 can electrically be separated from the Multi-Level Cell NAND type flash memory 12 and a desired function test can be performed.

According to the semiconductor memory device of the present embodiment, the same advantageous effects as the above-described (1) to (4) can be obtained. Further, the following advantageous effects (5) to (7) can be obtained.

(5) The area of mounting can be reduced and microfabrication can advantageously be achieved.

As has been described above, in the semiconductor chip 10 of this embodiment, the SDRAM 111, Multi-Level Cell NAND type flash memory 12, controller 13 and two-Level Cell NAND type flash memory 14 are mounted in the same package.

Since the Multi-Level Cell NAND type flash memory 12 and controller 13 can further be mounted, a memory system, which has conventionally been constructed in combination with a memory card, can be fabricated as a 1-package (1-package-solution memory system). Compared to the case in which the memory system is combined with the memory card, the area of mounting can be reduced and microfabrication can advantageously be achieved. For the same reason, reduction in weight can advantageously be achieved.

Since the Multi-Level Cell NAND type flash memory 12 is mounted, large-capacity data, such as pictures, motion video and music, which have been increasing in accordance with recent developments in functions of mobile phones, can be stored, and therefore the embodiment can advantageously cope with an increase in capacity of data. Moreover, since the controller 13 having the memory I/F (NAND I/F) 17 and SD card I/F 18 is mounted, large-capacity data of the Multi-Level Cell NAND type flash memory 12 can be converted to serial data.

(6) Erroneous read/write of the Multi-Level Cell NAND type flash memory 12 can advantageously be prevented.

As has been described above, the ratio of the ECC (Error Correcting Code) region 35-2 in the redundant region 34-2 of the Multi-Level Cell NAND type flash memory 12 is set to be greater than the ratio of the ECC region 35-1 in the redundant region 34-1 of the two-Level Cell NAND type flash memory 14. For example, in the present embodiment, the ratio of the ECC region 35-2 is about three times greater than the ratio of the ECC region 35-1.

Therefore, when read/write operations are executed on the Multi-Level Cell NAND type flash memory 12, a greater number of error correcting codes are added and erroneous read/write can advantageously be prevented.

(7) Reliability can advantageously be enhanced.

The signal pin VSSQ differs from the signal pin VSS in that the signal pin VSSQ is a signal pin for supplying a ground power supply voltage to a circuit of the input/output system while the signal pin VSS is a signal pin for supplying a ground power supply voltage to a circuit (a circuit of the core system) which is other than the circuit of the input/output system. Similarly, the signal pin VDDQ differs from the signal pin VDD in that the signal pin VDDQ is a signal pin for supplying a power supply voltage to a circuit of the input/output system while the signal pin VDD is a signal pin for supplying a power supply voltage to a circuit (a circuit of the core system) which is other than the circuit of the input/output system.

Since the signal pins of ground/power supply voltages are separated between the circuit of the input/output system and the circuit of the other system (i.e. the circuit of the core system), output noise, which occurs due to the circuit of the input/output system, is prevented from affecting the circuit of the other system. Therefore, the reliability can advantageously be enhanced.

Besides, the signal pins VSS(Q) and VDD(Q) of power supply voltages, or the signal pins VSS and VCC of power supply voltages, are arranged as pairs at neighboring positions. Specifically, these pins are disposed at position (C, 4) and position (C, 5); position (C, 8) and position (C, 9); position (G, 2) and position (H, 2); position (H, 10) and position (H, 11); position (N, 4) and position (N, 5); position (N, 6) and position (N, 7); and position (N, 8) and position (N, 9). With this arrangement, power supply noise can uniformly be produced and power supply noise can be reduced.

The row (row M) of signal pins D2 to D15 is disposed at positions (M, 4), (M, 5), (M, 6), (M, 7), (M, 8) and (M, 9) so as to neighbor, and to be positioned over, the row (row N) of signal pins VSS, VSS, etc. By disposing the row (row M) of signal pins D2 to D15 so as to neighbor, and to be positioned over, the row (row N) of signal pins VSS, VSS, etc., the length of wiring (not shown in FIG. 11) for electrically connecting the wires 25 and solder balls 28 is reduced. Thereby, inductance is reduced, and output noise is reduced.

The reliability is advantageously enhanced in that the input signals and arrangement of the signal pins VSS, D2, etc. can be selected and the output noise and power supply noise can be reduced.

Fifth Embodiment

A semiconductor memory device according to a fifth embodiment of the present invention is described with reference to FIG. 17. In the description below, a detailed description of parts common to those in the first embodiment is omitted.

Figure 17:
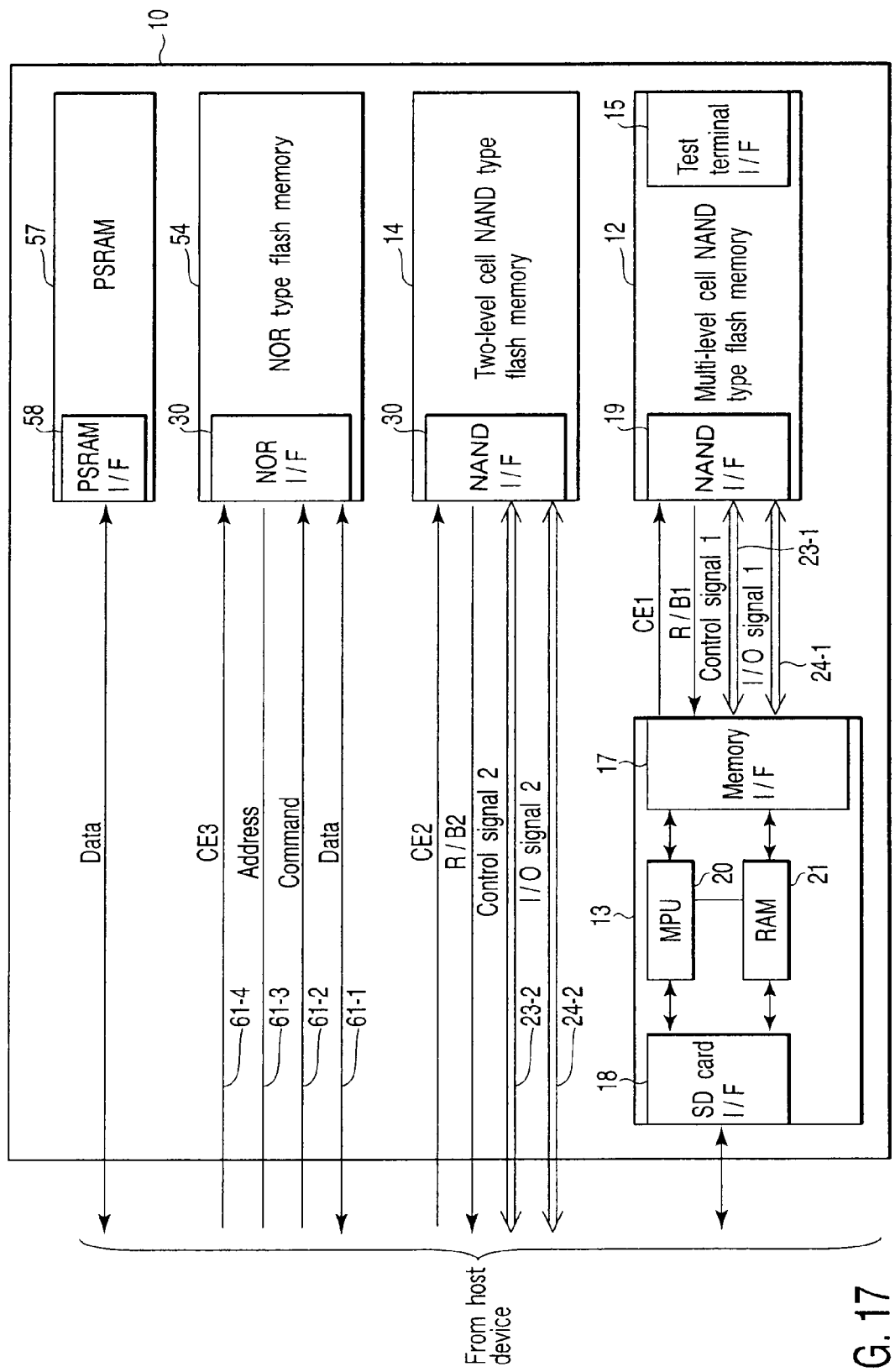
FIG. 17 is a block diagram showing a semiconductor memory device according to a fifth embodiment of the present invention.

As shown in FIG. 17, the fifth embodiment differs from the first embodiment in that the semiconductor chip 10 includes a NOR type flash memory 54 having a NOR I/F 56, and a PSRAM 57 having a PSRAM I/F 58.

The NOR type flash memory 54 is a flash memory which can read out data at random. The NOR type flash memory 54 transmits/receives data, a command, an address, a chip enable signal CE3 to/from the host device via the NOR I/F 56 over different signal lines 61-1, 61-2, 61-3 and 61-4.

The pseudo-static RAM (PSRAM) 57 is configured to temporarily expand program code, such as firmware, on the PSRAM 57 when the host device uses such program code.

In the other respects, the structure of the fifth embodiment is substantially the same as that of the first embodiment, so a detailed description is omitted here.

As has been described above, according to the semiconductor memory device of the present embodiment, the same advantageous effects as the above-described (1) to (7) can be obtained.

Where necessary, the structure of the present embodiment can be adopted.

Sixth Embodiment

Example of Memory System

Figure 19:
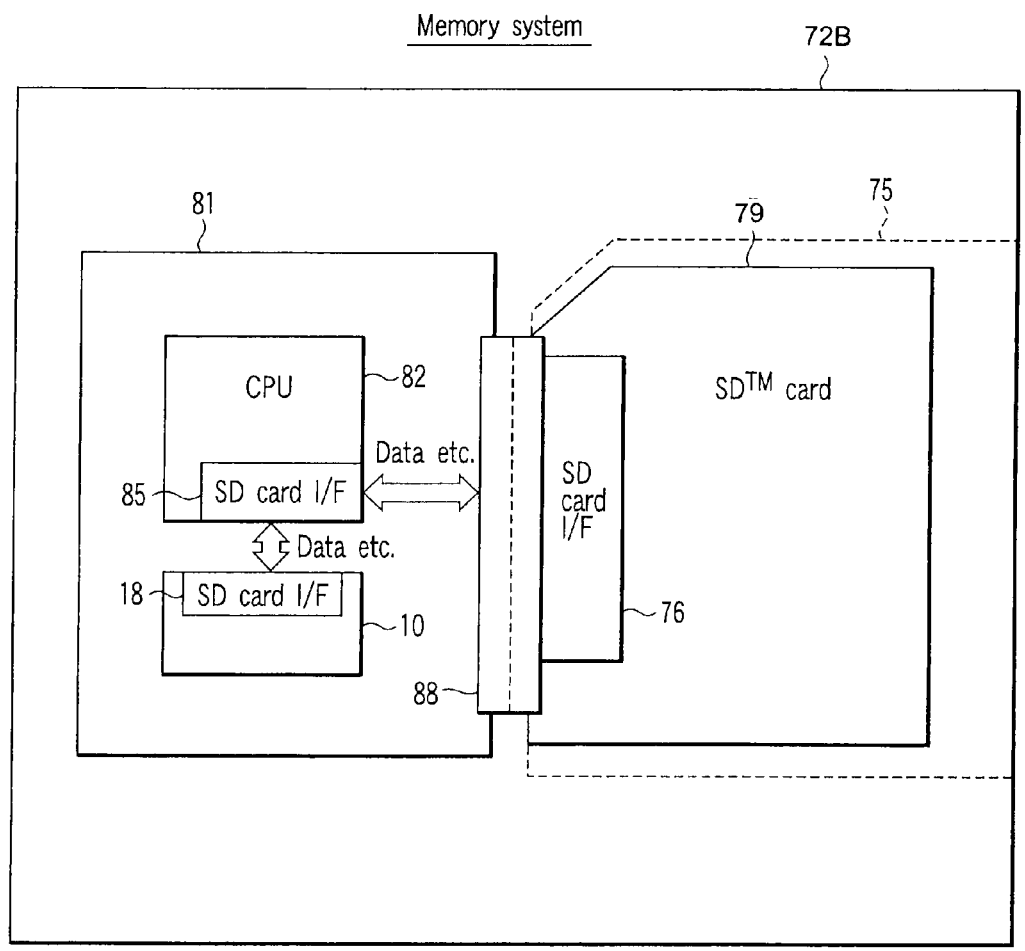
FIG. 19 is a block diagram showing the memory system according to the sixth embodiment of the invention.

Next, a memory system according to a sixth embodiment of the present invention is described with reference to FIG. 18 and FIG. 19. The memory system is applied, for example, to a mobile phone. This embodiment relates to an example of the memory system including the above-described semiconductor chip 10. FIG. 18 shows a mobile phone including the memory system according to this embodiment. FIG. 19 is a block diagram showing the memory system according to this embodiment. In the description below, a detailed description of parts common to those in the first embodiment is omitted.

As shown in FIG. 18 and FIG. 19, the mobile phone comprises an upper body part 71 having a main screen 74, and a lower body part 72A (FIG. 18) and 72B (FIG. 19) having a key pad 73 and a card slot 75 for insertion of an SD™ card 79.

The lower body part 72A (FIG. 18) and 72B (FIG. 19) includes a CPU (Central Processing Unit) 82 and the above-described semiconductor chip 10, which are mounted on a motherboard 81.

The CPU 82 has an SD card I/F 85. The CPU 82 accesses the semiconductor chip 10 according to the above-described embodiments and the SD™ card 79 via the SD card I/F 85, and executes transfer of data, etc.

The SD™ card 79 has an SD card I/F 76. The SD™ card 79 is an external memory which includes, for example, a two/Multi-Level Cell NAND type flash memory and executes transfer of data, such as music data or video data, with a mobile phone, etc.

If the SD™ card 79 is inserted in the card slot 75, the SD card I/F 76 is electrically connected to a connector 88 that is provided within the card slot 75. The SD™ card 79 accesses the CPU 82 via the SD card I/F 76 and connector 88 and executes transfer of data, etc.

According to the semiconductor memory device of this embodiment, the same advantageous effects as the above-described (1) to (7) can be obtained.

Moreover, the memory system including the semiconductor chip 10 comprises the semiconductor chip 10, the CPU 82 having the SD card I/F 85 for accessing the semiconductor chip 10, and the SD™ card 79 having the SD card I/F 76 for accessing the CPU 82.

Thus, the SD card I/F 85 of the CPU 82 can commonly be used with the SD™ card 79 which is inserted in the card slot 75, and the semiconductor chip 10 according to the above-described embodiments. Therefore, the size of the mobile phone can advantageously be reduced in that the area occupied by the interface (SD card I/F in this example) is reduced.

Since the SD™ card 79 is provided as an external memory, image data, etc. can be stored not only in the semiconductor chip 10 but also in the SD™ card 79. Thus, this embodiment can advantageously cope with the increase in data capacity of the mobile phone.

The memory system according to this embodiment is applicable not only to the mobile phone, but also to other host devices such as a PC (Personal Computer).

In the first to sixth embodiments, the NAND type flash memories 12, 14 are exemplified. However, the invention is similarly applicable to other types of nonvolatile memories such as AND type flash memories.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a first nonvolatile memory including a first external interface and being configured to record a single bit in one memory cell, the first external interface being connected to first signal pins accessed from outside of the semiconductor memory device;
a second nonvolatile memory including a first memory interface and being configured to record multiple bits in one memory cell; and
a controller including a second external interface and a second memory interface, the second external interface being connected to second signal pins accessed from outside of the semiconductor memory device, the second memory interface being connected to the first memory interface, and the second memory interface not being connected to the first external interface.

2. The semiconductor memory device according to claim 1, wherein the first nonvolatile memory, the second nonvolatile memory and the controller are included in a single multi chip package.

3. The semiconductor memory device according to claim 2, wherein the first and second nonvolatile memories are stacked on a substrate via a spacer, the controller is provided on one of the first and second nonvolatile memories, and the first and second nonvolatile memories and the controller are bonded to the substrate by bonding wires.

4. The semiconductor memory device according to claim 2, wherein the first signal pins and the second signal pins are disposed on a back surface of the multi chip package.

5. The semiconductor memory device according to claim 4, wherein the second signal pins are disposed on a central area of the back surface of the multi chip package.

6. The semiconductor memory device according to claim 5, wherein the second signal pins are surrounded by the first signal pins.

7. The semiconductor memory device according to claim 1, further comprising:
   an oscillation circuit that generates a clock signal and sends the clock signal to the controller, an oscillation frequency of the clock signal being determined by a capacitor and resistor circuit.

8. The semiconductor memory device according to claim 7, further comprising:
   third signal pins which electrically connect the capacitor and resistor circuit to the oscillation circuit,
   wherein the capacitor and resistor circuit are disposed outside of the semiconductor memory device.

9. The semiconductor memory device according to claim 8, wherein the first nonvolatile memory, the second nonvolatile memory, the controller and the oscillation circuit are included in a single multi chip package and the third signal pins are disposed at a position near one side of a back surface of the multi chip package.

10. The semiconductor memory device according to claim 9, wherein the capacitor and resistor circuit include,
    a first resistor element and a second resistor element connected at one end to an input of the oscillation circuit; and
    a capacitor element which has one electrode connected to an output of the oscillation circuit and has the other electrode connected to the other ends of the first and second resistor elements.

11. The semiconductor memory device according to claim 1, wherein the second nonvolatile memory includes a first test terminal interface connected to fourth signal pins accessed from outside of the semiconductor memory device.

12. The semiconductor memory device according to claim 1, further comprising:
    a third nonvolatile memory including a third memory interface and being configured to record multiple bits in one memory cell;
    an I/O bus connecting the second memory interface commonly to the first memory interface and the third memory interface, the I/O bus configured to transmit commands, addresses and data; and
    a control signal bus connecting the second memory interface commonly to the first memory interface and the third memory interface, the control signal bus configured to transmit control signals for the second and third nonvolatile memories.

13. The semiconductor memory device according to claim 12, wherein the second nonvolatile memory includes a first test terminal interface connected to fourth signal pins accessed from outside of the semiconductor memory device and the third nonvolatile memory includes a second test terminal interface connected to fifth signal pins accessed from outside of the semiconductor memory device.

14. The semiconductor memory device according to claim 12, further comprising:
    a volatile random access memory including a third external interface and being configured to temporarily store at least one part of data that is read out from the first nonvolatile memory, the third external interface being connected to fifth signal pins accessed from outside of the semiconductor memory device.

15. The semiconductor memory device according to claim 14, wherein the first nonvolatile memory stores at least one of a program code or a firmware of an external host system.

16. The semiconductor memory device according to claim 14, wherein the volatile random access memory is a synchronous DRAM.

17. The semiconductor memory device according to claim 1, wherein the first nonvolatile memory is a NAND type flash memory of a first chip and the second nonvolatile memory is a NAND type flash memory of a second chip.

18. The semiconductor memory device according to claim 1, wherein the first nonvolatile memory is configured to store data that requires a higher reliability and has a smaller capacity than the second nonvolatile memory.

19. The semiconductor memory device according to claim 1, wherein the second external interface is an SD memory interface and the second signal pins receive data, power supply voltage signals with a first polarity and a second polarity, a clock signal and a command.

20. The semiconductor memory device according to claim 1, wherein
    a unit memory area of the first nonvolatile memory includes a first data region and a first redundant region, the first redundant region including a first ECC region,
    a unit memory area of the second nonvolatile memory includes a second data region and a second redundant region, the second redundant region including a second ECC region, and
    a ratio of the second ECC region in the second redundant region is greater than a ratio of the first ECC region in the first redundant region.

* * * * *